(12) United States Patent
Gardner et al.

(10) Patent No.: US 11,810,854 B2
(45) Date of Patent: Nov. 7, 2023

(54) MULTI-DIMENSIONAL VERTICAL SWITCHING CONNECTIONS FOR CONNECTING CIRCUIT ELEMENTS

(71) Applicant: Tokyo Electron Limited, Tokyo (JP)

(72) Inventors: Mark I. Gardner, Cedar Creek, TX (US); H. Jim Fulford, Marianna, FL (US); Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 16/535,174

(22) Filed: Aug. 8, 2019

(65) Prior Publication Data

US 2020/0365506 A1 Nov. 19, 2020

Related U.S. Application Data

(60) Provisional application No. 62/848,289, filed on May 15, 2019.

(51) Int. Cl.
*H01L 23/525* (2006.01)
*H01L 23/522* (2006.01)
(Continued)

(52) U.S. Cl.
CPC ...... *H01L 23/525* (2013.01); *H01L 21/76802* (2013.01); *H01L 21/76877* (2013.01); *H01L 21/823871* (2013.01); *H01L 23/5226* (2013.01); *H01L 23/5228* (2013.01); *H10N 70/231* (2023.02)

(58) Field of Classification Search
CPC ............. H01L 23/5226; H01L 23/5228; H01L 21/76802; H01L 21/76877; H01L 21/823871; H01L 45/06; H01L 27/0629; H01L 21/823475; H01L 45/122–126; H01L 45/04–065; H01L 23/525–528;
(Continued)

(56) References Cited

U.S. PATENT DOCUMENTS

| | | |
|---|---|---|
| 5,196,724 A | 3/1993 | Gordon et al. |
| 5,319,238 A | 6/1994 | Gordon et al. |

(Continued)

FOREIGN PATENT DOCUMENTS

| | | |
|---|---|---|
| KR | 10-2010-0069484 A | 6/2010 |
| WO | WO 92/20095 A1 | 11/1992 |

OTHER PUBLICATIONS

International Preliminary Report on Patentability and Written Opinion dated Nov. 16, 2021 in PCT/US2020/025931.

*Primary Examiner* — Latanya N Crawford Eason
(74) *Attorney, Agent, or Firm* — Oblon, McClelland, Maier & Neustadt, L.L.P.

(57) ABSTRACT

A semiconductor device includes a first level having a plurality of transistor devices, and a first wiring level positioned over the first level. The first wiring level includes a plurality of conductive lines extending parallel to the first level, a plurality of conductive vertical interconnects extending perpendicular to the first level, and one or more programmable vertical interconnects that extend perpendicular to the first level and include a programmable material having a modifiable resistivity in that the one or more programmable vertical interconnects change between being conductive and being non-conductive according to a current pattern.

8 Claims, 7 Drawing Sheets

(51) Int. Cl.
   *H01L 21/768* (2006.01)
   *H01L 21/8238* (2006.01)
   *H10N 70/20* (2023.01)

(58) Field of Classification Search
   CPC .. H01L 23/5222–5228; H01L 45/1683; H10N 70/231
   See application file for complete search history.

(56) References Cited

U.S. PATENT DOCUMENTS

| | | |
|---|---|---|
| 5,362,676 A | 11/1994 | Gordon et al. |
| 5,557,136 A | 9/1996 | Gordon et al. |
| 5,701,027 A | 12/1997 | Gordon et al. |
| 5,786,268 A | 7/1998 | Gordon et al. |
| 5,880,512 A | 3/1999 | Gordon et al. |
| 6,097,077 A | 8/2000 | Gordon et al. |
| 7,795,605 B2 | 9/2010 | Habib et al. |
| 7,843,005 B2 | 11/2010 | Nowak |
| 8,114,686 B2 | 2/2012 | Habib et al. |
| 8,421,186 B2 | 4/2013 | Li et al. |
| 8,901,532 B2 | 12/2014 | Lee et al. |
| 2004/0100814 A1* | 5/2004 | Hsu ............... G11C 13/0069 365/148 |
| 2007/0108429 A1* | 5/2007 | Lung ............... H01L 45/144 257/E45.002 |
| 2008/0106923 A1* | 5/2008 | Lung ............... H01L 45/1625 365/129 |
| 2009/0001336 A1 | 1/2009 | Habib et al. |
| 2009/0072215 A1* | 3/2009 | Lung ............... H01L 45/122 257/4 |
| 2009/0282375 A1* | 11/2009 | Habib ............... G01K 7/425 374/114 |
| 2010/0148141 A1 | 6/2010 | Lee et al. |
| 2010/0201440 A1 | 8/2010 | Nowak |
| 2010/0254425 A1 | 10/2010 | Habib et al. |
| 2012/0217465 A1 | 8/2012 | Lee et al. |
| 2012/0306048 A1 | 12/2012 | Li et al. |
| 2015/0091067 A1* | 4/2015 | Pillarisetty ........ H01L 29/66795 257/288 |
| 2015/0311257 A1* | 10/2015 | Nardi ............... H01L 21/265 438/238 |
| 2017/0141125 A1* | 5/2017 | Tada ............... H01L 27/11807 |
| 2020/0357851 A1* | 11/2020 | Sung ............... H01L 27/24 |

* cited by examiner

MULTI-DIMENSIONAL VERTICAL SWITCHING CONNECTIONS FOR CONNECTING CIRCUIT ELEMENTS

CROSS REFERENCE TO RELATED APPLICATIONS

This application claims the benefit of U.S. Provisional Application No. 62/848,289 filed May 15, 2019, the entire contents of which is incorporated herein by reference.

FIELD OF THE INVENTION

The invention relates to microelectronic devices including semiconductor devices, transistors, and integrated circuits, including methods of microfabrication.

BACKGROUND

Microelectronic devices typically have a layer or plane of devices such as transistors, which can be field effect transistors (FET). These transistors are wired or connected together by using several wiring levels formed above these devices. Layers or planes in the wiring levels typically have horizontally running lines (also referred to as conductive lines). In between layers of horizontal conductive lines there are vertical interconnects (e.g., vias), which are essentially shorter conductive lines to connect a given conductive line in one plane to a corresponding conductive line or device in another plane. A particular geometry and placement of vias and conductive lines is based on a circuit design for either logic or memory applications.

SUMMARY

In conventional circuits, making modifications to functionality of circuit elements after microfabrication has limitations. Currently in order to enable a new circuit element, a design needs to turn a transistor on or off to enable a particular data path. This means that power is needed at all times to keep (for example) an added circuit element on or off. When the part is powered up the data to turn on or off a circuit block must be shorted in a hard code or by using non-volatile memory. If a designer wanted to connect a single path from a metal line (or a conductive line) to a different metal line (or a different conductive line), then a new photomask would be needed to make this connection. Moreover, if the designer wanted to remove a circuit then a new metal mask (photomask for a metal layer) would be needed to cut a particular metal line to create a short (or a connection). Adding new masks and custom masks to a microfabrication flow is expensive and slows throughput.

The present disclosure herein enhances 2D and 3D connections to logic circuits, memory elements, transistors and all circuit elements (with programming or programmable features) without constant modifications to photomasks. The present disclosure herein includes forming vertical interconnects (e.g., vias) between horizontal conductive lines that can be turned on or off after microfabrication. Making certain connections (e.g., metal routing) to be either conductive (low resistance) or less conductive/non-conductive (high resistance) enables a 3D switching matrix herein to be made between different conductive planes (or metal layers) and circuit elements. Conventional devices have wiring structures that include only conductive/metal connections.

Certain materials have unique properties that allow the materials to change from low resistance to high resistance, or from high resistance to low resistance. The present disclosure herein provides a method of making metal connections (or conductive connections) that integrate these unique materials to create an electrically programmed metal line (or conductive line) connected between two or more 3D planes of wiring and connections of various circuit elements. Accordingly, such configurations and designs enable circuit elements to be optionally programmed after a corresponding integrated circuit is completed thru fabrication.

One embodiment includes a microelectronic device that has a first level having a plurality of transistor devices. Multiple wiring levels are formed in different planes relative to the first level. The multiple wiring levels include lines of conductive material (also referred to as conductive lines) extending parallel to the first level. The wiring levels include vertical interconnects of conductive material (also referred to as conductive vertical interconnects) that connect given wiring levels to each other. The device includes a programmable vertical interconnect (or programmable via) of a particular wiring level. The programmable vertical interconnect is formed based on a first material having a modifiable resistivity in that the programmable vertical interconnect can change between being conductive and being non-conductive. Accordingly, various circuit elements can be indefinitely turned on or turned off.

Of course, an order of the manufacturing steps disclosed herein is presented for clarity sake. In general, these manufacturing steps can be performed in any suitable order. Additionally, although each of the different features, techniques, configurations, etc. herein may be discussed in different places of the present disclosure, it should be noted that each of the concepts can be executed independently from each other or in combination with each other. Accordingly, the present disclosure can be embodied and viewed in many different ways.

It should be noted that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

According to an aspect of the disclosure, a semiconductor device is provided. The semiconductor device includes a first level having a plurality of transistor devices, and a first wiring level positioned over the first level. The first wiring level includes a plurality of conductive lines extending parallel to the first level, a plurality of conductive vertical interconnects extending perpendicular to the first level, and one or more programmable vertical interconnects that extend perpendicular to the first level and include a programmable material having a modifiable resistivity in that the one or more programmable vertical interconnects change between being conductive and being non-conductive.

In the disclosed semiconductor device, each of the plurality of conductive vertical interconnects is connected to a respective conductive line in the first wiring level and each of the one or more programmable vertical interconnects is connected to a respective conductive line in the first wiring level. In addition, each of the one or more programmable vertical interconnects is further connected to at least one of a conductive line in a second wiring level, a transistor, a capacitor, a resistor, or an inductor.

In some embodiments, the programmable material is a phase-changeable material that changes between being conductive and being non-conductive according to a current pattern delivered to the one or more programmable vertical interconnects. For example, the current pattern can include a first current pattern to cause the phase-changeable material to become amorphous, and a second current pattern to cause the phase changeable material to become crystalline.

In one embodiment, the programmable material is positioned at a bottom portion of each of the one or more programmable vertical interconnects and a conductive material is positioned over the programmable material to fill each of the one or more programmable vertical interconnects. In another embodiment, the programmable material fully fills each of the one or more programmable vertical interconnects.

In some embodiment, the programmable material includes a first material that changes resistivity in response to a third current pattern, and a second material that changes resistivity in response to a fourth current pattern. Accordingly, the one or more programmable vertical interconnects includes a first programmable vertical interconnect that is formed based on the first material, and a second programmable vertical interconnect that is formed based on the second material.

In the disclosed semiconductor device, each of the one or more programmable vertical interconnects is positioned at a respective location to toggle a predetermined function of a corresponding integrated circuit.

According to another aspect of the disclosure, a method forming a semiconductor device is provided. In the disclosed method, a plurality of conductive lines is formed as a part of a first wiring level of the semiconductor device. The first wiring level is positioned over a first level having a plurality of transistor devices. The plurality of conductive lines extends parallel to the first level. Further, a programmable vertical bridge (also referred to as programmable vertical interconnect) is formed that is positioned below the plurality of conductive lines and extends perpendicular to the first level. The programmable vertical bridge physically connects a first conductive line of the plurality of conductive lines in the first wiring level, and is formed based on a first material that changes phase between a conductive state and a non-conductive state according to a current pattern delivered to the programmable vertical bridge. The programmable vertical bridge is further connected to at least one of a second conductive line in a second wiring level, a transistor, a capacitor, a resistor, or an inductor.

In one embodiment, a first relief pattern is formed in a dielectric material positioned over a substrate, where the first relief pattern has a plurality of vertical openings. The first material is subsequently deposited to fill the vertical openings of the first relief pattern. A portion of the first material that fills one of the plurality of vertical openings can be covered by a first mask. An uncovered portion of the first material can be removed, where the uncovered portion of the first material fills other vertical openings of the plurality of vertical openings. The first mask is then removed, and the other vertical openings of the plurality of vertical openings are filled with a conductive material.

In another embodiment, one vertical opening is uncovered and other vertical openings of the plurality of vertical openings are covered. The first material is deposited in the uncovered vertical opening. Further, a portion of the first material is removed in the uncovered vertical opening so that the first material is partially filled in the uncovered vertical opening. The other vertical openings of the plurality of vertical openings are then uncovered. A conductive material is subsequently deposited in the other vertical openings and the uncovered vertical opening so that the uncovered opening is partially filled with the first material and partially filled with the conductive material.

In some embodiments, the first material is deposited in a crystalline state. In some embodiments, the first material is deposited in an amorphous state.

In yet another aspect of the disclosure, a method for operating a semiconductor device is provided. In the disclosed method, the semiconductor device is accessed. The semiconductor has a first level including a plurality of transistor devices and a wiring structure positioned over the first level. The wiring structure includes a plurality of wiring levels having one or more conductive lines and one or more conductive vertical interconnects. The one or more conductive lines extend parallel to the first level and the one or more conductive vertical interconnects extend perpendicular to the first level. Each of the one or more conductive vertical interconnects is connect to a respective conductive line.

The wiring structure further includes at least one programmable vertical bridge (also referred to as programmable vertical interconnect) that extends perpendicular to the first level and connects one of the one or more conductive lines. The programmable vertical bridge is formed based on a programmable material having a modifiable resistivity in that the programmable vertical bridge changes between being conductive and being non-conductive.

Further, in the disclosed method, a specific circuit function is identified to operate the programmable vertical bridge accordingly by transmitting a current pattern to the programmable vertical bridge.

In some embodiments, a first specific circuit function is identified to deactivate the programmable vertical bridge by transmitting a first current pattern to the programmable vertical bridge. The first current pattern causes the programmable vertical bridge to change from being conductive to being non-conductive, such that the specific circuit function is deactivated.

In some embodiments, a second specific circuit function is identified to activate the programmable vertical bridge by transmitting a second current pattern to the programmable vertical bridge. The second current pattern causes the programmable vertical bridge to change from being conductive to being non-conductive, such that the specific circuit function is activated.

In some embodiments, a third specific circuit function is identified to deactivate the programmable vertical bridge by transmitting a third current pattern to the programmable vertical bridge. The third current pattern causes the programmable vertical bridge to change from being non-conductive to being conductive, such that the specific circuit function is deactivated.

In some embodiments, a fourth specific circuit function is identified to activate the programmable vertical bridge by transmitting a fourth current pattern to the programmable vertical bridge. The fourth current pattern causes the programmable vertical bridge to change from being non-conductive to being conductive, such that the specific circuit function is activated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

Techniques herein include forming programmable connections (bridges) between horizontal conductive lines or wires that can be turned on or off after microfabrication. The horizontal conductive lines typically extend in a plane that is a parallel to a layer or plane of transistor devices of a circuit. For example, microelectronic circuits typically include multiple levels or planes of conductive lines that are interconnected and that include vertical interconnects (vias) to connect conductive lines in a given plane to conductive lines in another plane. These vias are vertical in that they typically extend perpendicular to planes of conductive lines (or metal layers) as well as a level of transistor devices. In one embodiment, the programmable connections include one or more connections made using a phase-changeable material. The phase-changeable material can be changed from conducting material to non-conducting material after microfabrication by using a pattern of current delivered to the programmable connections (phase-changeable material). Accordingly, any number of circuit elements can be shorted or electrically connected after microfabrication.

As such, techniques herein eliminate the conventional need to make new photomasks and have complex data code stored in die to power on or off a circuit block. Being able to program vertical interconnects between metal lines (or conductive lines) can be done after a corresponding die is placed in a package or in a system. This ability enables fast changes to circuit design functionality by turning on circuit blocks indefinitely or turning off circuit blocks indefinitely. Such functionality changes remain whether a given device is powered or not powered. As can be appreciated, many benefits can be realized with such techniques. For example, a power for operation can be reduced because no active circuit elements are needed to keep a new circuit block active each time when a die is started and used.

Methods of forming programmable vertical bridges (also referred to as programmable vertical interconnects) between conductive lines can be integrated into conventional metallization process flows. For example, in one process flow, a metal layer (or wiring level) is created. This metal layer can be created by way of a single damascene or dual damascene. Metal (or a conductive material) can be deposited, masked, and etched. Conductive liners can be optionally added. A phase-changeable material can be deposited in all holes (via openings) and then selectively masked to cover a portion of the phase-changeable material that needs to be kept while an uncovered portion of the phase-changeable material is removed. Then a conductive material can be deposited in uncovered openings. Alternatively, conductive vertical interconnects and metal lines (or conductive lines) are formed first, and then phase-changeable material is deposited in via openings that are created or are selectively masked or filled with a replaceable/sacrificial material.

The phase-changeable material (programmable material) is a material that can change its physical properties to be either conductive or non-conductive (resistive or insulating). Example materials include InSe, SbSe, SbTe, InSbSe, InSbTe, GeSbSe, GeSbTeSe and AgIn InSe, SbSe, SbTe, InSbSe, InSbTe, GeSbSe, GeSbTeSe, AgIn, Ag2Se, Ge2Se3, GeSb, Ge2Sb2, GeSbTeN, and Ge2Sb2Te5. These materials are phase-changeable in that a molecular structure can be changed between being amorphous and crystalline in response to a particular current pattern delivered to this material. A liner material can optionally be used to hold or help contain the phase-changeable materials. Example liner materials include TiN, TaN, Ta, TiW, Ti, Ru, Au, W, Cu, Pt, CoSi2, NiSi2, TiSi2, Mo, Al, CuAl, and CuMn.

Figure 1:
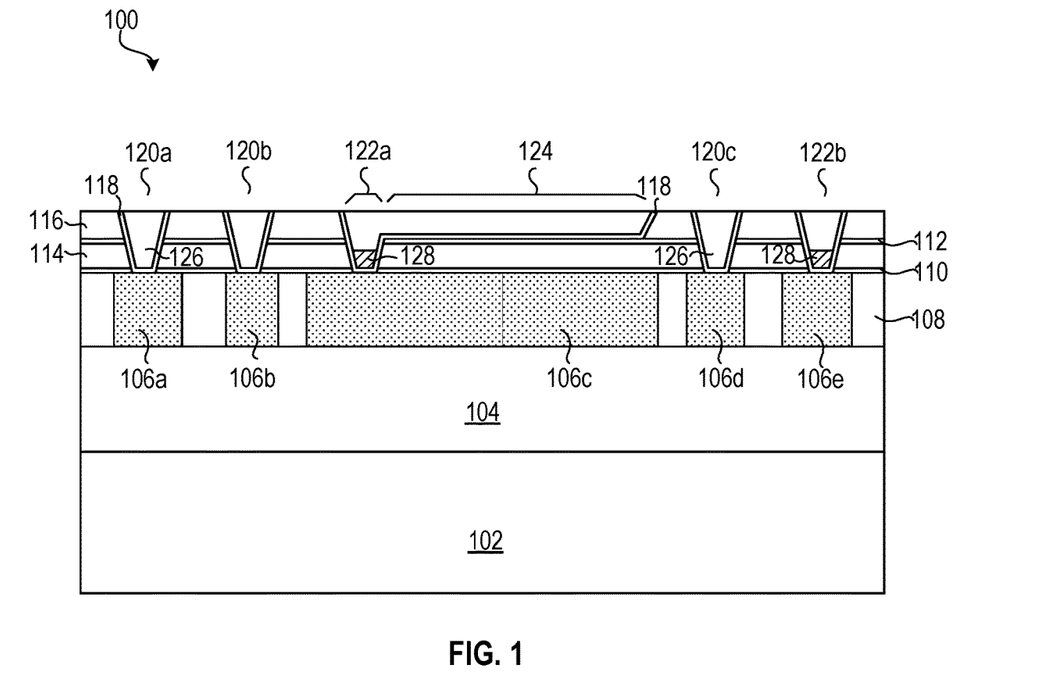
FIG. 1 is a cross-sectional view of an exemplary substrate including programmable vertical interconnects, in accordance with some embodiments.

FIG. 1 is a cross-section of an example substrate segment 100 that includes programmable vertical interconnects. Note that a simplified wiring structure is shown. As shown in FIG. 1, the substrate segment 100 can include a substrate 102. The substrate 102 may include a silicon (Si) substrate, a germanium (Ge) substrate, a silicon germanium (SiGe) substrate, and/or a silicon-on-insulator (SOI) substrate. Over the substrate 102, an insulating layer 104 can be formed. The insulating layer can be made of SiO, SiN, or other suitable dielectric materials. A first dielectric layer 108 can be formed over the insulating layer 104. Further, a plurality of conductive lines 106a-106e can be formed in the first dielectric layer 108. The conductive lines 106 can be made of tungsten, copper, ruthenium, cobalt, or other suitable conductive materials. Over the conductive lines 106, a plurality of conductive vertical interconnects (or conductive vias) 120a-120c can be formed in a dielectric stack. The dielectric stack include a first etch stop layer 110 that is formed over the conductive lines 106, a second dielectric layer 114 is formed over the first etch stop layer 110, a second etch stop layer 112 is formed over the second dielectric layer 114, and a third dielectric layer 116 is formed over the second dielectric layer 114. The first and second etch stop layers can include SiN, SiC, SiCN, or other suitable materials.

As shown in FIG. 1, the conductive vertical interconnects 120 pass through the first etch stop layer 110 and are electrically connected with the conductive lines 106. For example, a conductive vertical interconnect 120a is electrically connected with a conductive line 106a. In some embodiments, the conductive vertical interconnects 120 are made of a conductive material 126. The conductive material 126 can be tungsten, copper, ruthenium, cobalt, or other suitable conductive materials. In some embodiments, a liner 118 is formed between the conductive material 126 and the dielectric stack, or between the conductive material 126 and the conductive lines 106. The liner 118 can be Ti, TiN, Ta, TaN, or other suitable materials. The liner 118 can prevent a delamination or a migration of the conductive material 126.

The substrate segment 100 also includes one or more programmable vertical interconnects. For example, two programmable vertical interconnects 122a and 122b are included in the substrate segment 100. The programmable vertical interconnects 122 are formed by a programmable material 128 and the conductive material 126. The programmable material 128 is positioned at a bottom portion of the programmable vertical interconnects, and the conductive material 126 is positioned over the programmable material 128. The substrate segment 100 further can include one or more conductive lines. For example, a conductive line 124 is formed and connected with one of the programmable vertical interconnects, such as the programmable vertical interconnect 122a.

The programmable material 128 is designated within the wiring structure which includes the conductive lines 106, the conductive vertical interconnections 120, the programmable vertical interconnections 122, and the conduction line 124. The programmable material 128 can be a phase-changeable material and is shown as a portion of the programmable vertical interconnects (programmable vias) within a circuit. The programmable material 128 can be changed from conductive to non-conductive, or from non-conductive to conductive. The programmable material 128 can maintain the conductive or non-conductive property without power. Thus, after a specific current pattern activates or changes the programmable material 128, the programmable material 128 can then remain either conductive or resistive regardless of whether a corresponding chip is powered. In other words, a material characteristic change of the programmable material 128 is not volatile.

A via region is generally a vertical region of metal (metal extending in the vertical direction) that connects two conductive layers (in different planes) of metal, or transistors, or circuit element regions. Such techniques herein can be used in via regions at any part of a circuit. For example, a programmable vertical interconnect shown in FIG. 1 can be applied as a programmable via that connects Metal 1 layer to a silicon substrate. The programmable via can also connect two nanolayer silicon stacks, or multiple N-dimensional nanolayer stacks. The programmable via can further connect Metal 2 layer to Metal 1 layer, or Metal 3 layer to Metal 4 layer or Metal n layer, et cetera. Thus, such programmable vias can connect between any planes of metal lines or planes of circuit elements.

Figure 2:
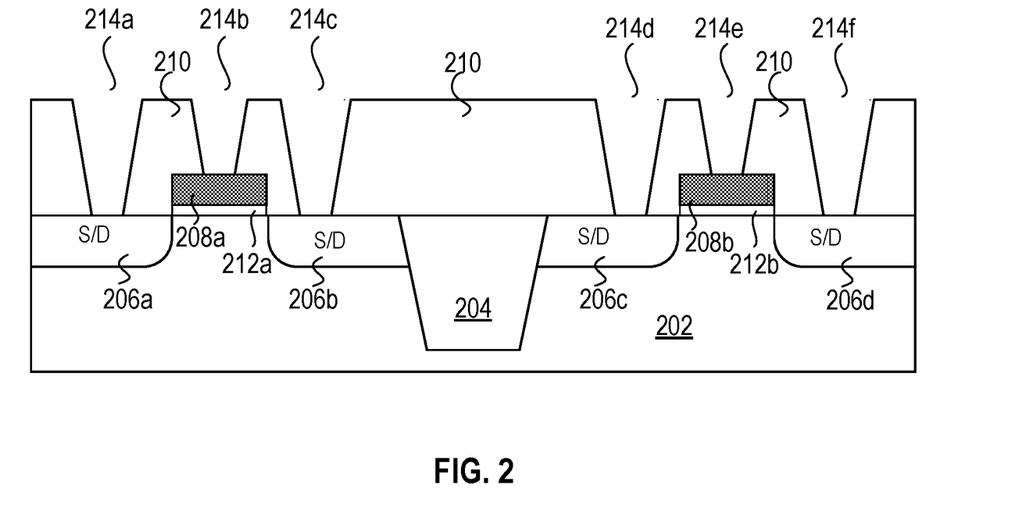
FIGS. 2-5 are cross-sectional views of various intermediate steps of manufacturing a semiconductor device including programmable vertical interconnects, in accordance with some embodiments.

As can be appreciated, multiple configurations and process flows are enabled herein. In one flow, a programmable vertical interconnect is formed to serve as source/drain contacts. FIGS. 2-5 illustrate an exemplary flow to form the programmable vertical interconnect as source/drain contacts. As shown in FIG. 2, a STI (shallow trench isolation) 204 is formed in a substrate 202. In addition, a plurality of source/drain (S/D) structures 206a-206d are formed in the substrate 202 through an ion implantation process. Further, a plurality of gate stack 208a-208b can be formed over the substrate 202. A plurality of gate block layers 212a-212b are formed between the substrate and the gate stacks 208. Based on the S/D structures 206, the gate stacks 208 and the gate block layers 212, a plurality of transistors can be formed. The transistors can be planar FET, FinFET, nanosheets, et cetera. For example, two transistors can be formed in FIG. 2 that are separated by the STI 204. In addition, an insulating layer 210 is then formed over the gate stacks and a plurality of contact openings 214a-214f are formed to uncover the S/D structures and the gate stacks.

Figure 3:
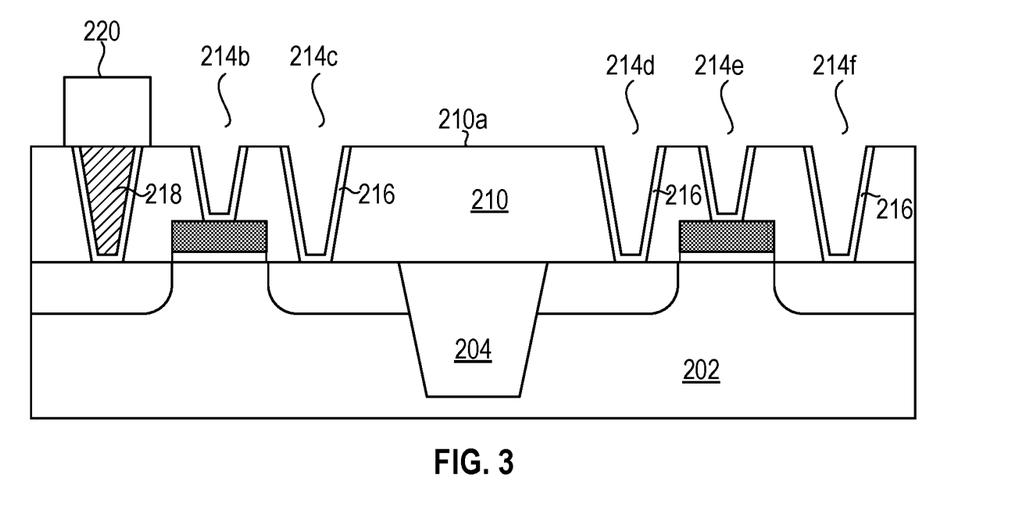

Referring now to FIG. 3, a liner 216 is optionally deposited in contact openings 214. The substrate 202 can be masked (for example, with photoresist) so that only specific contact openings are uncovered by a first mask. For example, a contact opening 214a is uncovered in FIG. 3. Then a programmable material, such as the phase-changeable material 128, can be deposited in the uncovered contact openings to form one or more programmable vertical interconnects. For example, a programmable vertical interconnect 218 is included in FIG. 3. The first mask is then removed. Any overburden of the phase-changeable material (or excessive phase-changeable material) can further be removed from a top surface 210a of the insulating layer 210 through a CMP process or an etching back process. A second photoresist mask 220 can subsequently be formed to cover the programmable vertical interconnects that needs to be kept (e.g., 218) and leave other contact openings uncovered, which is shown in FIG. 3. Note that the masking flow mentioned above is merely an example, and multiple masking flows can be optionally used.

Figure 4A:
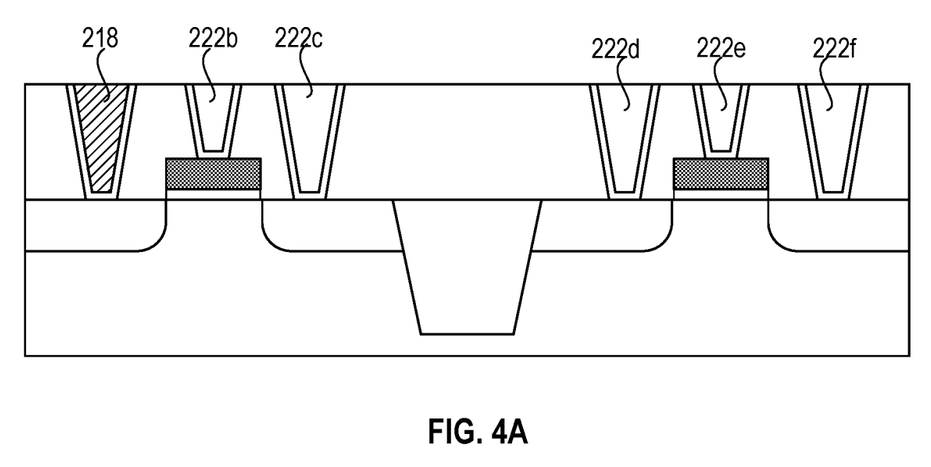

As shown in FIG. 4A, the second photoresist mask 220 can be removed, and the remaining contact openings (e.g., 214b-214f) can be filled with the conductive material 126. A subsequent surface planarization process (e.g., CMP) can be applied to remove any overburden of the conductive material. After the surface planarization process, the programmable vertical interconnect 218, and a plurality of conductive vertical interconnects 222b-222f are formed.

The phase-changeable material 128 that is deposited in FIG. 3 can include InSe, SbSe, SbTe, InSbSe, InSbTe, GeSbSe, GeSbTeSe and AgIn InSe, SbSe, SbTe, InSbSe, InSbTe, GeSbSe, GeSbTeSe, AgIn, Ag2Se, Ge2Se3, GeSb, Ge2Sb2, GeSbTeN, and Ge2Sb2Te5. The phase-changeable material 128 can be deposited in the contact openings in either a crystalline state or amorphous state. Many suitable processes can be applied to form the phase-changeable material, such as CVD (chemical vapor deposition), PVD (physical vapor deposition), diffusion, sputter, and ALD. For example, Ge2Sb2Te5 can be prepared by thermal evaporation of single-element sources at a base pressure of 1×10-8 mbar.

Figure 4B:
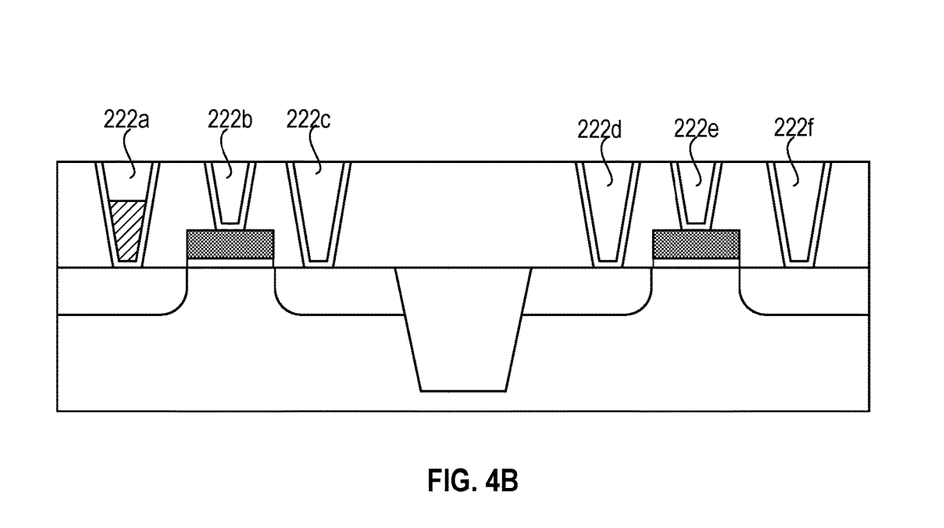

In some embodiments, a given contact opening (e.g., 214a) filled with the phase-changeable material can also be recessed within the contact opening such as by partial etch back. For example, as shown in FIG. 4B, the phase-changeable material in the contact opening 214a is partially removed.

With one or more contact openings partially filled with the new material, all masking layers (e.g., the second photoresist mask) can be removed. Then remaining contact openings (e.g., 214b-214f) can be filled with the conductive material 126. This can include filling an upper portion of a given contact opening, such as 214a, having the phase-changeable material positioned at the bottom portion. As shown in FIG. 4B, after formation of the conductive material, a plurality of conductive vertical interconnects (also referred to as conductive vias) 222b-222f, and a programmable vertical interconnect (also referred to as programmable via) 222a can be formed. The programmable vertical interconnect 222a can be partially filled with the phase-changeable material 128 and partially filled with the conductive material 126.

It should be noted that an entire contact opening can be filled with the phase-changeable material, or only a portion of the contact opening is filled with the phase-changeable material. This can depending on the material and the circuit capability of changing the material. In some embodiments, a longer bridge (or longer dimension) of the phase-changeable material can require more current pulsing to toggle.

Figure 5:
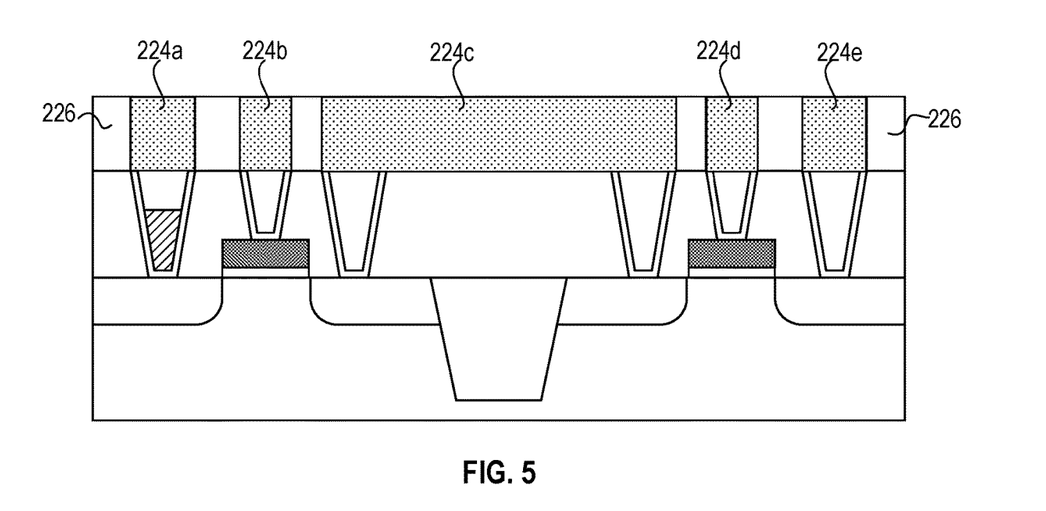

Processing can then continue with conventional metallization fabrication processes. For example, as shown in FIG. 5, a plurality of conductive lines 224a-224e can be formed. The conductive lines 224 are formed in a dielectric layer 226, and connected to the conductive vertical interconnects 222b-222f and the programmable vertical interconnect 222a. FIG. 5 illustrates a wiring level, such as a first wiring level, that is positioned over transistor devices, and includes the conductive lines 224, the conductive vertical interconnects 222b-222f, and the programmable vertical interconnect 222a.

Figure 6:
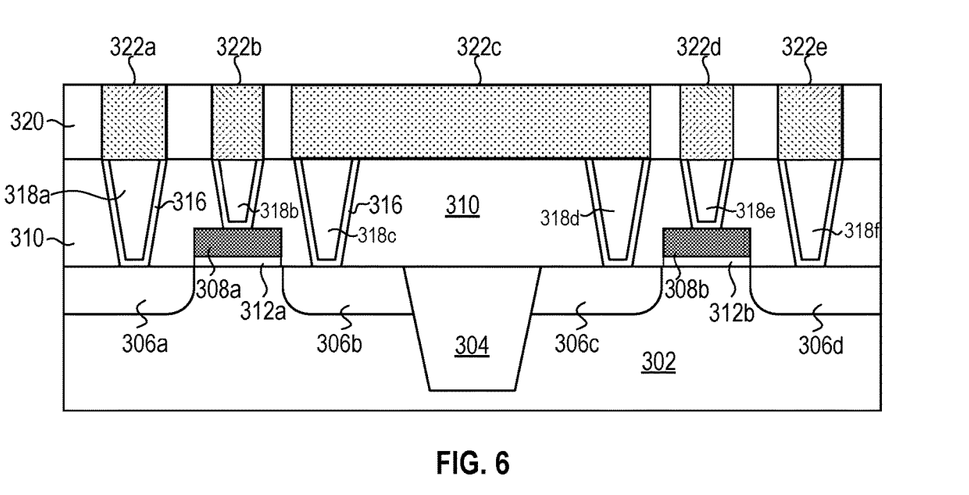
FIGS. 6-10 are cross-sectional views of various intermediate steps of manufacturing another semiconductor device including programmable vertical interconnects, in accordance with some embodiments.

FIGS. 6-10 illustrate another exemplary flow to form the programmable vertical interconnect over CMOS (complementary metal oxide semiconductor) devices. As shown in FIG. 6, a plurality of S/D structures 306a-306d are formed in a substrate 302. A plurality of gate stacks 308a-308b are formed over the substrate 302. A plurality of gate block layers 312a-312b are arranged between the gate stacks and the substrate. The S/D structures, the gate stacks and the gate block layers forms a plurality of CMOS transistors. For example, two CMOS transistors can be formed in FIG. 6 and the two CMOS transistors are separated by a STI 304. Over the substrate 302, a plurality of conductive vertical interconnects 318a-318f are formed in an insulating layer 310. The conductive vertical interconnects 318 are electrically connected to the S/D structures and the gate stacks. The conductive vertical interconnects can be filled with the conductive material 126. In some embodiments, the conductive vertical interconnects can also include a liner 316. The liner 316 can be formed before the conductive material is introduced. As shown in FIG. 6, the liner 316 is positioned between the conductive material and adjacent components (e.g., the insulating layer, the S/D structures, the gate stacks). Over the insulating layer 310, a first dielectric layer 320 is formed, and a plurality of conductive lines 322a-322e are formed in the first dielectric layer 320. The conductive lines 322 can be Metal 1 layers and be electrically coupled to the conductive vertical interconnects 318. The Metal 1 layers can be formed through conventional metallization processes (e.g., single damascene, dual damascene).

Figure 7:
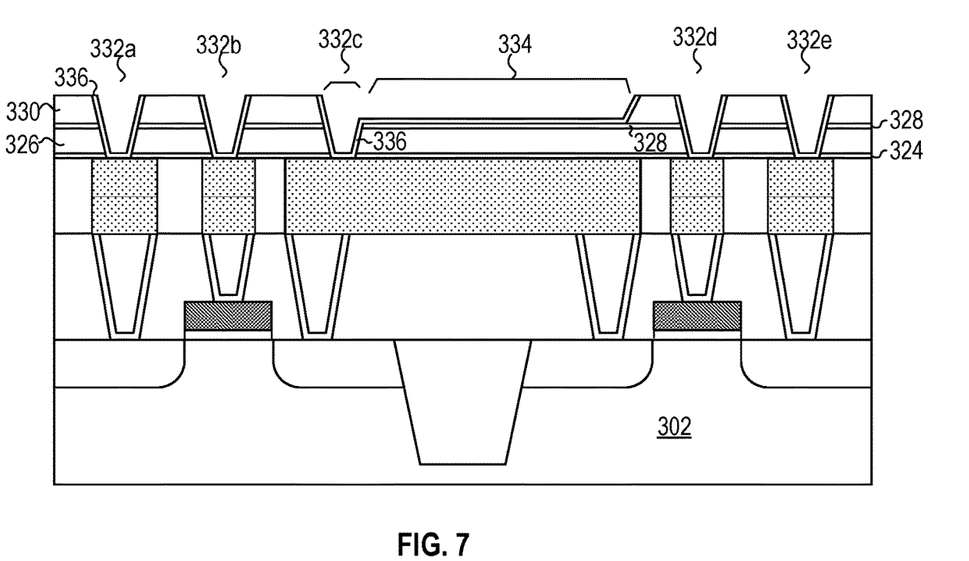

In FIG. 7, a dual damascene flow can then be executed to form Vial (or vertical interconnect) and Metal 2. Of course, a single damascene can also be executed. As shown in FIG. 7, a first etch stop layer 324 can be formed over the conductive lines 322. A second dielectric layer 326 can be formed over the first etch stop layer 324. A second etch stop layer 328 can be formed over the second dielectric layer 326, and a third dielectric layer 330 can be positioned over the second etch stop layer 328. The first etch stop layer 324 can server as an etch stop layer when an etching process is introduced to form a plurality of via openings (or vertical interconnect openings). The second etch stop layer 328 can function as an etch stop layer when the etching process is introduced to form a plurality of trenches. Still referring to FIG. 7, according to the dual damascene flow, a relief pattern (or a first relief pattern) can be formed. The relief pattern can include a plurality of via openings 332a-332e, and a plurality of trenches. For example, a trench 334 is included in FIG. 7. When the relief pattern is formed, a liner layer 336 can be deposited to cover the via openings and trenches.

Figure 8:
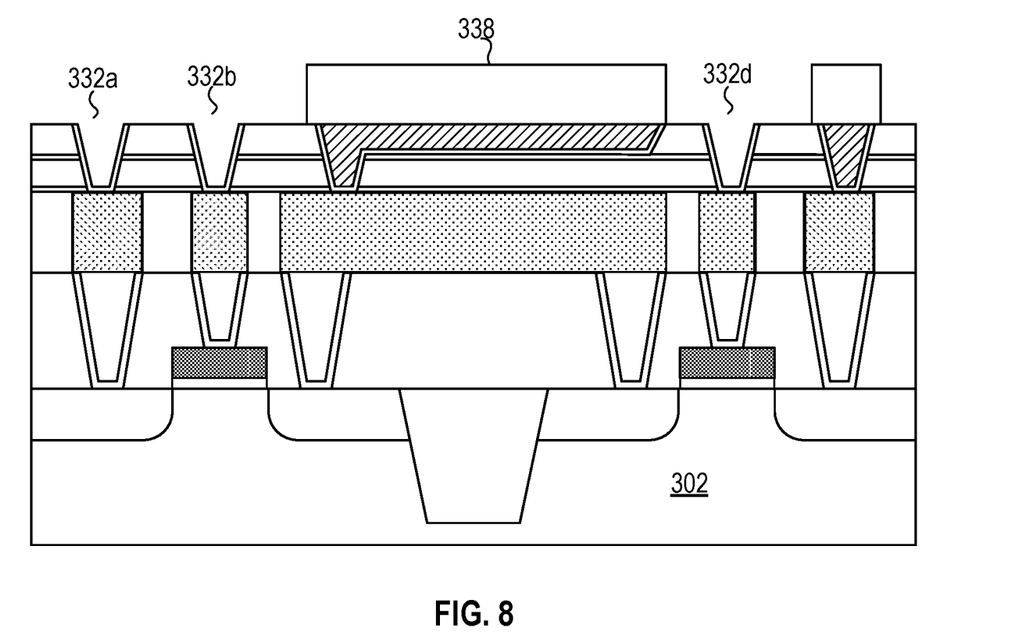

As shown in FIG. 8, the phase-changeable material can be deposited toward the substrate 302 to fill the via openings 332a-332e and the trench 334. Any overburden (excessive) of the phase-changeable material can be removed by a CMP (chemical mechanical polishing) process or an etch back process. Then a protection mask 338 can be formed over the phase-changeable material which needs to be kept. For example, the protection mask 338 is deposited over the phase-changeable material that fills the via openings 332c and 332e, and the trench 334. Uncovered phase-changeable material in other via openings or trenches, such as in via openings 332a, 332b and 332d, can then be etched away.

Figure 9:
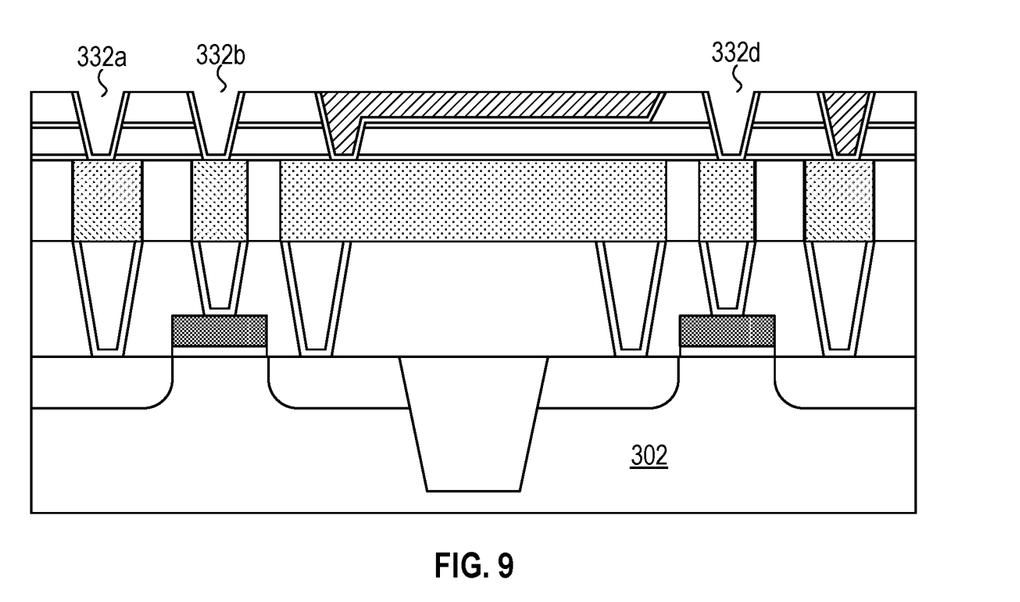

In FIG. 9, the protection mask 338 can be removed from the substrate. For example, the protection mask 338 can be removed through a plasma ashing process. After the removal of the protection mask 338, the phase-changeable material that fills the via openings 332c and 332e, and trench 334 is uncovered. In addition, the other via openings 332a, 332b and 332d are still uncovered.

Figure 10:
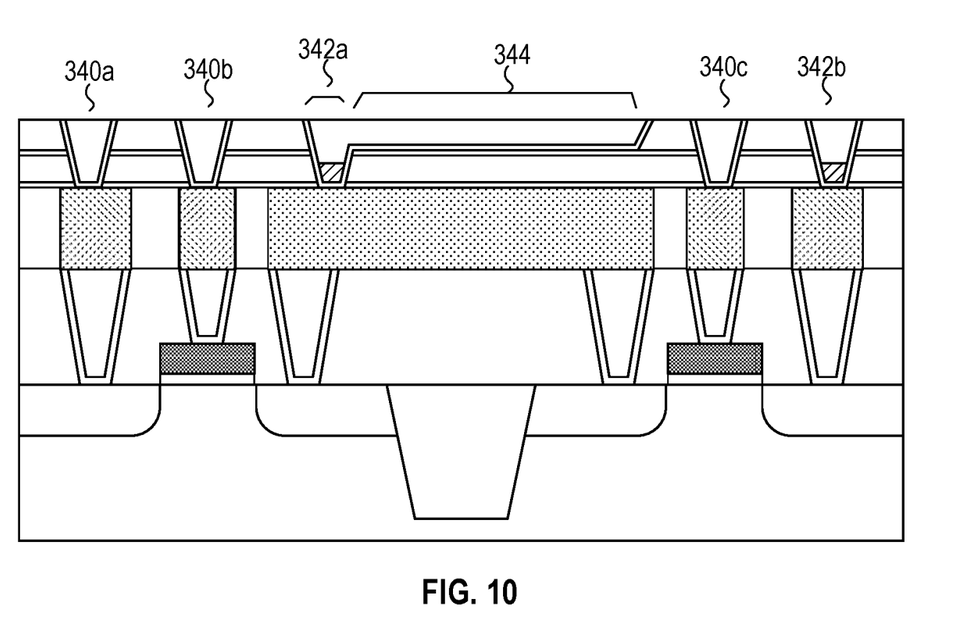

Optionally, the phase-changeable material can be etched back partially or can be recessed to remove a portion of the phase-changeable material that fills in the via openings 332c and 332e, and trench 334. As shown in FIG. 10, for example, the phase-changeable material in the trench 334 can be removed fully, and the phase-changeable material in the via openings 332c and 332e can be recessed so that the phase-changeable material remains at a bottom portion of the via openings 332c and 332e. A subsequent metallization can be applied with a metal seed layer, a metal fill and a metal CMP. The metal fill can be operated by filling via opening with the conductive material through an electroplating process. When the metal CMP is completed, a plurality of conductive vertical interconnects (conductive vias) 340a-340c, one or more programmable vertical interconnects (programmable vias) 342a-342b, and one or more conductive lines (e.g., 344) can be formed. Manufacturing process can then continue with conventional formation of additional wiring levels.

It should be noted that instead of depositing the phase-changeable material firstly and then masking a portion of the phase-changeable material which needs to be kept, a part of the via openings to be filled with the phase-changeable material can be masked firstly through a mask layer, a metal or conductive material is deposited in unmasked areas (e.g., the uncovered via openings). The mask layer is removed and then the phase-changeable material is deposited in uncovered via openings. Alternatively, via openings for receiving the phase-changeable material can be formed in a dielectric layer (e.g., the second dielectric layer 326, the third dielectric layer 330 in FIG. 7) through an etching process after a metal deposition on a corresponding plane. As can be appreciated, there are several different process flows available to form one or more programmable vias (programmable vertical interconnects) within a wiring structure. For bottom up filling, such as with ruthenium, the phase-changeable material can be added to a top portion of a particular via. With copper, the phase-changeable material is typically formed in a bottom portion of a via opening.

Regarding programming the phase-changeable material (also referred to as new material), once a given circuit has been completed through all fabrication steps, one or more 3D vertical switches can be programmed. The new material described in the present disclosure is now located between two electrodes. By flowing current into the new material, a state of matter of the new material can change. Thus, the state of the new material can be either an amorphous state, a crystalline state, or a mixture of amorphous and crystalline. A particular state of matter results in drastically different resistance values. With future nano technology applications, a contact cross sectional area will decrease and this enables smaller programming power to enable the switch to toggle between off to on states. The new material may be deposited in either an amorphous, crystalline, or mixture of amorphous/crystalline states.

Using a high, short current pulse and rapid ramp down produces the high resistance state (amorphous). While a moderate long current pulse reduces resistance by ramping down the new material slowly, gradually cooling resulting in inducing crystal growth produces the low resistance state. This can be time and temperature dependent. Other mixture of states can occur between the complete amorphous state and complete crystalline state. The amplitude and ac pulse width of the injected current pulse determines the programmed state (i.e., conductive vs. non-conductive). Different material types need different power pulses (I-V) for programming. Power requirements are also a function of a via size. After programming of the new material is completed, the programmable via will remain in that state of matter for optimum circuit connections. For example, routine signal processing will not change a state of the matter.

As can be appreciated, there are many benefits and operation modes enabled by such programmable vias (programmable vertical interconnects) herein. For example, a signaling path can be re-routed if there is a block failure. Particular data paths can be enabled or disabled. Some circuits have an array of data paths or multiple redundancies. Some transistors are controlled by master transistors. With smaller amounts of phase-changeable material used to bridge conductors, less power is needed to toggle between conductive/resistive states. In some embodiments, depending on type and amount of material, multiple orders of magnitude of power can be required to change states (toggle between amorphous and crystalline). The new material can be deposited in different states. For example, it can be deposited as amorphous or crystalline or a mix. Crystalline can be easier to deposit in smaller holes/dimensions, while depositing amorphous material can be faster or easier.

As can be appreciated, several embodiments are contemplated herein, including a programmable vertical interconnect (also referred to as programmable vertical bridge), methods of making, and methods of using. One embodiment is a microelectronic device comprising a first level having a plurality of transistor devices or other semiconductor devices such as capacitors. Multiple wiring levels are formed in different planes relative to the first level. The multiple wiring levels can include a first wiring level positioned over the first level, and a second wiring level positioned over the first level. The wiring levels include lines of conductive material (or conductive lines) extending parallel to the first level. The wiring levels include vertical interconnects (vias) that connect given wiring levels to each other. The wiring levels can be formed above and/or below a plane of transistor devices.

A programmable vertical interconnect is formed at a particular wiring level. The programmable vertical interconnect (programmable via) comprises a programmable material having a modifiable resistivity in that the programmable vertical interconnect can change between being conductive and non-conductive. When the programmable vertical interconnect is programmed, the programmable material itself that forms the programmable via can be changed, switched, or "programmed" to function as a conductor or as a non-conductor (resistor), or as a partial conductor. Note that non-conductor herein means that the programmable material is resistive to conducting electrical signals of the corresponding microelectronic device relative to a conductive state in which the programmable vertical interconnect conducts electricity between two conductive lines or structures. Accordingly, the programmable vertical interconnect is a resistivity changeable bridge between two conductors or conductive entities. In another embodiment, at least one vertical interconnect within the microelectronic device is formed of a phase-changeable material that has a resistance value modifiable by electrical current pattern delivered to the phase-changeable material.

The programmable vertical interconnect can change between being conductive and non-conductive according to a current pattern delivered to the programmable vertical interconnect. The programmable vertical interconnect can be formed based on a phase-changeable material. Delivering a first current pattern to the programmable vertical interconnect causes the phase-changeable material to become amorphous, while delivering a second current pattern to the programmable vertical interconnect causes the phase-changeable material to become crystalline. For example, a given pulse pattern can have short pulse or long pulses and accordingly affect the molecular structure.

The programmable vertical interconnect can fill an entire cross-sectional segment of a corresponding via opening. In other words, metal or conductive material of a line or conductive entity does not form a part of the vertical interconnect, such as around an outside portion of the segment, that would enable a signal transmission. Instead, either an entire via is removed and replaced with the programmable material, or the programmable material fills an opening between two conductive lines or extends a conductive line, where the programmable vertical interconnect can connect two conductive lines that are less than 500 microns in diameter, or less than 500 nanometers in cross-sectional width.

The programmable vertical interconnects can be formed within a given metal layer (or wiring level), or can be formed on two or more metal layers. The programmable vertical interconnect can connect two parallel conductive lines that are positioned in two different wiring levels, or can replace a segment of a particular conductive via (conductive vertical interconnect). The programmable vertical interconnect can include a second phase-changeable material that is different from the first phase-changeable material in that a resistivity shift is triggered by different current patterns. The first programmable vertical interconnect is formed of a first material that changes resistivity in response to a first current pattern, and a second programmable vertical interconnect is formed of a second material that changes resistivity in response to a second current pattern. In other words, for example, a bi-layer programmable vertical bridge is formed. If either of the first and second phase-changeable materials is programmed to be a conductor, then signals can be transmitted across the bi-layer programmable vertical bridge.

The programmable vertical interconnect is positioned at a location to toggle a predetermined function of a corresponding integrated circuit. For example the function can be an individual transistor, standard cell, collection of transistors, redundant circuit, memory array, or larger function on an integrated circuit. As can be appreciated, any number of chip functions can be toggled accordingly.

Another embodiment includes a method of forming a microelectronic device. The method includes forming conductive lines as part of a wiring level of a semiconductor device. Forming a programmable vertical bridge that physically connects a first conductive line to a second conductive line or second conductive element (e.g., source/drain). The programmable vertical bridge can be formed by using a first material that can phase change between a conductor and an insulator.

The first material can be deposited in a crystalline state or in an amorphous state. This is beneficial because (depending on a particular phase-changeable material) depositing in a crystalline state can be used for filling smaller spaces, while depositing material as amorphous can be more efficient.

Forming the programmable vertical bridge includes forming a first relief pattern, such as a damascene pattern, in a dielectric material, where the first relief pattern includes a plurality of vertical openings (or via openings). The first material is deposited to fill vertical openings of the first relief pattern. Selected portions of the first material are masked by using a first mask. Uncovered portions of the first material are removed from the substrate. The first mask is removed, and then vertical openings are filled with a conductive material. For dual damascene, both via openings and trenches are filled.

Forming the programmable vertical bridge includes masking vertical openings of a first relief pattern in a dielectric material that is positioned over a substrate. The first material is deposited in one or more uncovered vertical openings. The first material is recessed to less than a height of the vertical openings resulting in a partially filled vertical opening. Masked vertical openings are then uncovered. A conductive material is deposited in vertical openings to form conductive vertical interconnects including depositing the conductive material in vertical openings that is partially filled with the first material.

Forming the programmable vertical bridge can include depositing a conductive material in vertical openings to form conductive vertical interconnects, and depositing the first material in at least one vertical opening to physically connect two conductive lines. Forming the programmable vertical bridge can include depositing a conductive material in vertical openings to form conductive vertical interconnects, and depositing the first material in at least one vertical opening to physically connect a transistor source/drain contact with a conductive line.

Embodiments can include a method of using a microelectronic device. Methods can include accessing a microelectronic device that has an array of transistor devices and a wiring structure including multiple wiring levels having lines of conductive material and vertical interconnects of conductive material that connect given lines of conductive material together. The wiring structure includes at least one programmable vertical bridge that connects two conductive lines. This programmable vertical bridge can extend in a vertical direction as a via or a portion of a via. The programmable vertical bridge includes a first material having a modifiable resistivity in that the programmable vertical bridge can change between being conductive and being non-conductive. A specific circuit function to deactivate corresponding to the programmable vertical bridge is identified. Then a first current pattern is transmitted to the programmable vertical bridge that causes the programmable vertical bridge to change from being conductive to being non-conductive, such that the specific circuit function is deactivated. Alternatively, a specific circuit function is identified to activate corresponding to the programmable vertical bridge. Then a second current pattern is transmitted to the programmable vertical bridge that causes the programmable vertical bridge to change from being conductive to being non-conductive, such that the specific circuit function is activated. In other embodiments, a third current pattern is delivered to the programmable vertical bridge that causes the programmable vertical bridge to change from being non-conductive to being conductive, such that the specific circuit function is deactivated. A fourth current pattern can be delivered to the programmable vertical bridge that causes the programmable vertical bridge to change from being non-conductive to being conductive, such that the specific circuit function is activated.

Accordingly, adding a programmable vertical bridge between particular conductive lines provide increased device functionality by being able to indefinitely turn on or off specific device function based on whether the programmable vertical bridge is caused to be a conductor or a non-conductor.

As can be appreciated with techniques herein, circuit connections may be changed in an existing layout by a 3D programmable feature. New circuits may be created/modified with existing layout. An ALD (atomic layer deposition) deposition of new materials can establish record small feature sizes with nano crystals at minimum feature sizes. Such precise deposition enables techniques herein to provide low-power, scalable, nano 3D connections. Vias herein can function either as a conductive or high resistance connection, and this functionality enables higher 3D density connections. Moreover, new connections between planes of metal are now possible with this switching capability as described herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for forming a semiconductor device, comprising:
   forming a plurality of conductive lines as a part of a first wiring level of the semiconductor device, the first wiring level being positioned over a first level having a plurality of transistor devices, the plurality of conductive lines extending parallel to the first level;
   forming a programmable vertical bridge that is positioned below the plurality of conductive lines and extends perpendicular to the first level, the programmable vertical bridge physically connecting a first conductive line of the plurality of conductive lines in the first wiring level, the programmable vertical bridge being formed based on a first material that changes phase between a conductive state and a non-conductive state according to a current pattern delivered to the programmable vertical bridge; and
   forming a first conductive vertical bridge that is positioned below the plurality of the conductive lines and extends perpendicular to the first level, the first conductive vertical bridge being spaced apart from the programmable vertical bridge and physically connecting a second conductive line of the plurality of the conductive lines, wherein forming the programmable vertical bridge comprises:
      forming a first relief pattern in a dielectric material positioned over a substrate, the first relief pattern having a plurality of vertical openings;
      depositing the first material to fill the vertical openings of the first relief pattern;
      covering a portion of the first material that fills one of the plurality of vertical openings by a first mask to form the programmable vertical bridge;
      removing a uncovered portion of the first material that fills other vertical openings of the plurality of vertical openings;
      removing the first mask; and
      filling the other vertical openings of the plurality of vertical openings with a conductive material to form a plurality of conductive vertical interconnects that includes the first conductive vertical bridge.

2. The method of claim 1, wherein the first material is deposited in a crystalline state.

3. The method of claim 1, wherein the first material is deposited in an amorphous state.

4. A method for forming a semiconductor device, comprising:
   forming a plurality of conductive lines as a part of a first wiring level of the semiconductor device, the first wiring level being positioned over a first level having a plurality of transistor devices, the plurality of conductive lines extending parallel to the first level;
   forming a programmable vertical bridge that is positioned below the plurality of conductive lines and extends perpendicular to the first level, the programmable vertical bridge physically connecting a first conductive line of the plurality of conductive lines in the first wiring level, the programmable vertical bridge being formed based on a first material that changes phase between a conductive state and a non-conductive state according to a current pattern delivered to the programmable vertical bridge; and
   forming a first conductive vertical bridge that is positioned below the plurality of the conductive lines and extends perpendicular to the first level, the first conductive vertical bridge being spaced apart from the programmable vertical bridge and physically connecting a second conductive line of the plurality of the conductive lines, wherein forming the programmable vertical bridge comprises:
      uncovering one vertical opening and covering other vertical openings of a plurality of vertical openings in a first relief pattern that is formed in a dielectric material over a substrate;
      depositing the first material in the uncovered vertical opening;
      removing a portion of the first material in the uncovered vertical opening so that the first material is partially filled in the uncovered vertical opening;
      uncovering the other vertical openings of the plurality of vertical openings; and
      depositing a conductive material in the other vertical openings to form a plurality of conductive vertical interconnects that includes the first conductive vertical bridge and in the uncovered vertical opening so that the uncovered opening is partially filled with the first material and partially filled with the conductive material to form the programmable vertical bridge.

5. A method for operating a semiconductor device, the method comprising:
   accessing the semiconductor device that has a first level including a plurality of transistor devices and a wiring structure positioned over the first level, the wiring structure including a plurality of wiring levels having a plurality of conductive lines and one or more conductive vertical interconnects, the plurality of conductive lines extending parallel to the first level and the one or more conductive vertical interconnects extending perpendicular to the first level, each of the one or more conductive vertical interconnects being connect to a respective conductive line, the wiring structure further including a first programmable vertical bridge that extends perpendicular to the first level, the first programmable vertical bridge being formed based on a programmable material having a modifiable resistivity in that the first programmable vertical bridge changes between being in a first molecular structure which is conductive and being in a second molecular structure which is non-conductive; and identifying a specific circuit function to operate the first programmable vertical bridge accordingly by transmitting a current pattern to the first programmable vertical bridge, wherein:

the one or more conductive vertical interconnects includes a first conductive vertical interconnect, the first conductive vertical interconnect is in contact with a first conductive line of the plurality of conductive lines, the first programmable vertical bridge is spaced apart from the first conductive vertical interconnect and in contact with a second conductive line of the plurality of conductive lines that is made of a conductive material, and the first programmable vertical bridge includes (i) a bottom portion made of the programmable material and (ii) a top portion made of the conductive material, disposed on the programmable material, and in direct contact with the second conductive line of the plurality of conductive lines.

6. The method of claim 5, wherein the first programmable vertical bridge further connects to at least one of a third conductive line of the plurality of conductive lines, a transistor, a capacitor, a resistor, or an inductor.

7. The method of claim 5, wherein the identifying indicates one of:

identifying a first specific circuit function to deactivate the first programmable vertical bridge by transmitting a first current pattern to the first programmable vertical bridge that causes the first programmable vertical bridge to change from being conductive to being non-conductive, such that the specific circuit function is deactivated;

identifying a second specific circuit function to activate the first programmable vertical bridge by transmitting a second current pattern to the first programmable vertical bridge that causes the first programmable vertical bridge to change from being conductive to being non-conductive, such that the specific circuit function is activated;

identifying a third specific circuit function to deactivate the first programmable vertical bridge by transmitting a third current pattern to the first programmable vertical bridge that causes the first programmable vertical bridge to change from being non-conductive to being conductive, such that the specific circuit function is deactivated; and identifying a fourth specific circuit function to activate the first programmable vertical bridge by transmitting a fourth current pattern to the first programmable vertical bridge that causes the first programmable vertical bridge to change from being non-conductive to being conductive, such that the specific circuit function is activated.

8. The method of claim 5, wherein the programmable material is positioned at a bottom portion of a second programmable vertical bridge of the wiring structure and the conductive material is positioned over the programmable material to fill the second programmable vertical bridge.

* * * * *